(12) United States Patent
Zeman et al.

(10) Patent No.: US 9,459,355 B1
(45) Date of Patent: Oct. 4, 2016

(54) RADIATION DETECTOR WITH STACKED BARRIER LAYERS AND METHOD OF FORMING THE SAME

(71) Applicant: GENERAL ELECTRIC COMPANY, Schenectady, NY (US)

(72) Inventors: Gregory Scott Zeman, Waukesha, WI (US); Faisal Saeed, Waukesha, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 14/788,151

(22) Filed: Jun. 30, 2015

(51) Int. Cl.
*G01T 1/20* (2006.01)
*G01T 1/164* (2006.01)

(52) U.S. Cl.
CPC ........... *G01T 1/1641* (2013.01); *G01T 1/2018* (2013.01)

(58) Field of Classification Search
CPC ..... G01T 1/2018; G01T 1/208; G01T 1/247; G01T 1/1612; G01T 3/06
See application file for complete search history.

(56) References Cited

U.S. PATENT DOCUMENTS

| | | | |
|---|---|---|---|
| 5,144,141 A * | 9/1992 | Rougeot | G01T 1/2018 250/366 |
| 7,439,516 B2 | 10/2008 | Zeman et al. | |
| 8,610,079 B2 | 12/2013 | Narayanaswamy et al. | |
| 2004/0113086 A1* | 6/2004 | Heismann | G01T 1/2928 250/370.09 |
| 2008/0237481 A1* | 10/2008 | Zentai | H01L 27/14618 250/370.12 |
| 2013/0026376 A1* | 1/2013 | Tokura | G01T 1/2018 250/366 |

FOREIGN PATENT DOCUMENTS

JP 2003209238 A * 7/2003

* cited by examiner

*Primary Examiner* — Kiho Kim
(74) *Attorney, Agent, or Firm* — Fletcher Yoder, P.C.

(57) ABSTRACT

In one embodiment, a radiation detector is provided. The radiation detector includes a scintillator layer that converts incident radiation into lower energy optical photons. The scintillator layer includes a plurality of pixels formed by one or more dividers, and the one or more dividers form one or more radiation pathways through the scintillator layer. The radiation detector also includes a photodetector layer that detects the lower energy photons generated by the plurality of pixels within the scintillator layer and signal electronics that receive signals generated by the photodetector layer. The radiation detector also includes one or more barrier layers disposed between the photodetector layer and the signal electronics. Each barrier layer of the one or more barrier layers includes electrically conductive vias containing a high Z material that blocks radiation from the one or more radiation pathways from reaching the signal electronics.

18 Claims, 5 Drawing Sheets

RADIATION DETECTOR WITH STACKED BARRIER LAYERS AND METHOD OF FORMING THE SAME

BACKGROUND

The subject matter disclosed herein relates to radiographic detectors for non-invasive imaging and particularly to the construction and use of a radiation detector having stacked layers of radio-opaque vias disposed within an electrical substrate.

In radiographic systems, an X-ray source emits radiation (e.g., X-rays) towards an object or subject (e.g., a patient, a manufactured part, a package, or a piece of baggage) to be imaged. As used herein, the terms "subject" and "object" may be interchangeably used to describe anything capable of being imaged. The emitted X-rays, after being attenuated by the subject or object, typically impinge upon an array of radiation detector elements of an electronic detector. The intensity of radiation reaching the detector is typically dependent on the attenuation and absorption of X-rays through the scanned subject or object. At the detector, a scintillator may convert some of the X-ray radiation to lower energy optical photons that strike detector elements configured to detect the optical photons. Each of the detector elements then produces a separate electrical signal indicative of the amount of optical light detected, which generally corresponds to the incident X-ray radiation at the particular location of the element. The electrical signals are collected, digitized and transmitted to a data processing system for analysis and further processing to reconstruct an image.

In certain situations, some portion of the X-rays, however, may bypass the scintillator without interacting with the scintillator material or may intersect the scintillator at one or more sites where the scintillator material is not present. For example, planes of non-scintillator material may be present that divide the scintillator into discrete "pixels" or detector elements. In these scenarios, some amount of the X-ray radiation may thus pass through the scintillator, such as along these dividers, without being absorbed and/or converted. Such X-ray radiation may therefore act to degrade any electronics or circuitry positioned in the path of the radiation. Accordingly, it may be beneficial to provide systems and methods that help reduce the amount of radiation impacting the electronics or circuitry positioned in the path of the radiation.

BRIEF DESCRIPTION

In one embodiment, a radiation detector is provided. The radiation detector includes a scintillator layer that converts incident radiation into lower energy optical photons. The scintillator layer includes a plurality of pixels formed by one or more dividers, and the one or more dividers form one or more radiation pathways through the scintillator layer. The radiation detector also includes a photodetector layer that detects the lower energy photons generated by the plurality of pixels within the scintillator layer and signal electronics that receive signals generated by the photodetector layer. The radiation detector also includes one or more barrier layers disposed between the photodetector layer and the signal electronics. Each barrier layer of the one or more barrier layers includes electrically conductive vias containing a high Z material that blocks radiation from the one or more radiation pathways from reaching the signal electronics.

In another embodiment, a radiation detector is provided. The radiation detector includes a photodetector layer that detects the lower energy photons generated by a scintillator layer and analog-to-digital conversion circuitry that receives signals generated by the photodetector layer. The radiation detector also includes one or more stacked barrier layers disposed between the photodetector layer and the analog-to-digital conversion circuitry. Each barrier layer of the one or more barrier layers includes a plurality of vias disposed within an electrical substrate. The plurality of vias are filled with a high Z material that blocks or absorbs incident radiation from the scintillator layer from reaching the analog-to-digital conversion circuitry.

In a further embodiment, a method is provided. The method includes forming a plurality of vias into two or more electrical substrate and filling each via of the plurality of vias with a high Z material. The method also includes stacking the two or more electrical substrates such that the plurality of filled vias are staggered with respect to one another.

BRIEF DESCRIPTION OF THE DRAWINGS

These and other features, aspects, and advantages of the present embodiments will become better understood when the following detailed description is read with reference to the accompanying drawings in which like characters represent like parts throughout the drawings, wherein.

DETAILED DESCRIPTION

Figure 1:
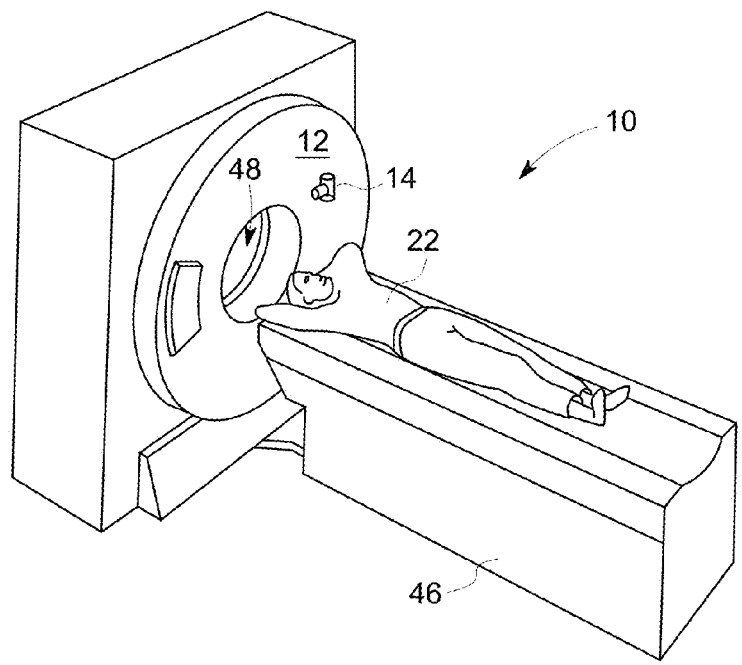
FIG. 1 depicts a combined pictorial view and block diagram of a CT imaging system suitable for use with embodiments of a detector as discussed herein.
Figure 1:
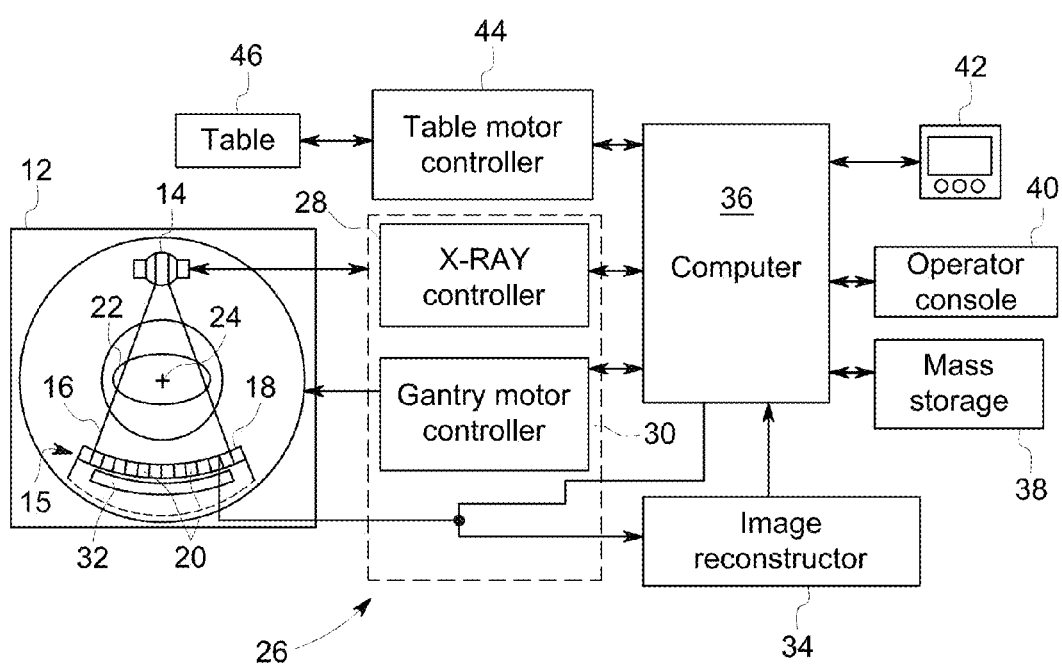

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Embodiments described herein relate to systems and methods for reducing an amount of incident radiation reaching circuitry and/or signal electronics disposed within a radiographic imaging system and/or along a radiation path. For example, signal electronics (e.g., analog-to-digital conversion circuitry) may be provided in close proximity to (e.g., vertically stacked beneath) a scintillator layer, a photodiode layer, or other readout components of a detector assembly of the imaging system. The detector may include components, such as a scatter grid or a scintillator layer, that absorb or mitigate (e.g., convert to lower energy optical photons) radiation emitted toward the detector assembly. However, X-ray transmissive gaps formed within the scintillator, such as due to the presence of elements used to define discrete detector elements (i.e., pixels) within the scintillator, may allow a portion of the radiation to bypass the scintillator and reach the circuitry, power supply, and/or signal electronics. In such instances, the radiation (e.g., X-rays) may impact the performance of the impacted circuitry, resulting in noise or other signal or performance degradation, or loss of basic functionality. Accordingly, in certain embodiments discussed herein, it may be beneficial to reduce or eliminate the radiation that reaches the circuitry and/or other signal electronics.

Accordingly, embodiments are discussed herein that relate to one or more stacked barrier layers having radiation absorbing elements or materials positioned so as to protect underlying circuitry from incident X-rays or other radiation. Specifically, the one or more stacked barrier layers may be disposed between a photodiode layer of the detector assembly and the circuitry and/or signal electronics of the detector assembly. In certain embodiments, each of the one or more barrier layers may be formed of an electronic substrate (e.g., ceramic substrates, organic substrates, etc.), and each barrier layer may include a plurality of vias disposed within the electronic substrate and containing an ionizing energy (e.g., X-ray and/or gamma ray) absorbing material. By way of example, in certain embodiments the ionizing energy absorbing material (e.g., high-Z material) may include one or more of tungsten, alumina, molybdenum, or any other suitable X-ray or gamma ray absorbing material. In certain embodiments, a plurality of cavities containing the absorbing material may be utilized and disposed within the electronic substrate in lieu of and/or in addition to the vias.

Further, in certain embodiments, the vias within each barrier layer may be arranged or patterned so as to correspond to locations that are more susceptible to X-ray transmission, such as along the X-ray transmissive planes dividing a scintillator into pixels. That is, the X-ray absorption or blocking provided by the vias, instead of being uniformly across the extent of the detector assembly, may instead be localized or patterned in certain regions where X-ray transmission is believed to be more likely to occur. In addition, the vias within the stacked barrier layers discussed herein may be staggered or offset between one or more layers to increase the effective area of radiation absorption or blocking, i.e., to increase the effective radiation absorbing width of the of the vias as seen from the direction of X-ray emission, while still maintaining an effective electrically conductive channel between the stacked layers of the detector assembly. In this manner, by staggering or offsetting the stacked arrangement of radiation blocking vias, incident radiation may be reduced and/or prevented from reaching the circuitry and/or signal electronics. Accordingly, it should be noted that in certain embodiments, the vias may help reduce an amount of radiation from reaching various circuitry and/or signal electronics, as well providing electrical connections that electrically couple features of the photodiode layer with features of the circuitry and/or signal electronics, as further described in detail below.

A detector as discussed herein may be utilized in a variety of radiographic imaging systems, such as computed tomography (CT) systems, fluoroscopic imaging systems, mammography systems, C-arm angiography imaging systems, tomosynthesis imaging systems, conventional radiographic imaging systems, and so forth. By way of example, in accordance with one embodiment, a CT imaging system is provided. The CT imaging system includes a metalized detector having signal electronics provided directly behind the scintillator/photodiode assembly. For simplicity, the present discussion generally describes the use of detectors and X-ray imaging systems in a medical imaging context. However, it should be appreciated that the described radiation detectors may also be used in non-medical contexts (such as security and screening systems and non-destructive detection systems) as well as in other imaging modalities employing ionizing radiation for non-invasive imaging (e.g., positron emission tomography (PET) and single-photon emission computed tomography (SPECT)). Further, it should be appreciated that the described radiation detectors may also be used in space technologies, nuclear power industries, atomic physics research, and/or with other industrial radiography uses.

With the foregoing in mind and referring to FIG. 1, a computed tomography (CT) imaging system 10 is shown as including a gantry 12 suitable for obtaining X-ray transmission data from a multitude of angular views about a patient. Gantry 12 has an X-ray source 14 that projects a beam of X-rays 16 toward a detector assembly 15 on the opposite side of the gantry 12. The detector assembly 15 includes a collimator assembly 18, a plurality of detector modules 20, and data acquisition systems (DAS) 32. The plurality of detector modules 20 detect the projected X-rays that pass through a medical patient 22, and DAS 32 converts the data to digital signals for subsequent processing. Each detector module 20 in a conventional system produces an analog electrical signal that represents the intensity of an impinging X-ray beam and hence the attenuated beam as it passes through the patient 22 and which is converted to a digital signal by conversion circuitry provided in the imaging system 10. During a scan to acquire X-ray projection data, gantry 12 and the components mounted thereon rotate about a center of rotation 24.

Rotation of gantry 12 and the operation of X-ray source 14 are governed by a control mechanism 26 of CT system 10. Control mechanism 26 includes an X-ray controller 28 that provides power and timing signals to an X-ray source 14 and a gantry motor controller 30 that controls the rotational speed and position of gantry 12. An image reconstructor 34 receives sampled and digitized X-ray data from DAS 32 and performs high-speed reconstruction. The reconstructed image is applied as an input to a computer 36, which stores the image in a mass storage device 38. Computer 36 also receives commands and scanning parameters from an operator via console 40. An associated display 42 allows the operator to observe the reconstructed image and other data from computer 36. The operator supplied commands and parameters are used by computer 36 to provide control signals and information to DAS 32, X-ray controller 28, and gantry motor controller 30. In addition, computer 36 operates a table motor controller 44, which controls a motorized table 46 to position patient 22 and gantry 12. Particularly, table 46 moves portions of patient 22 through a gantry opening 48.

Figure 2:
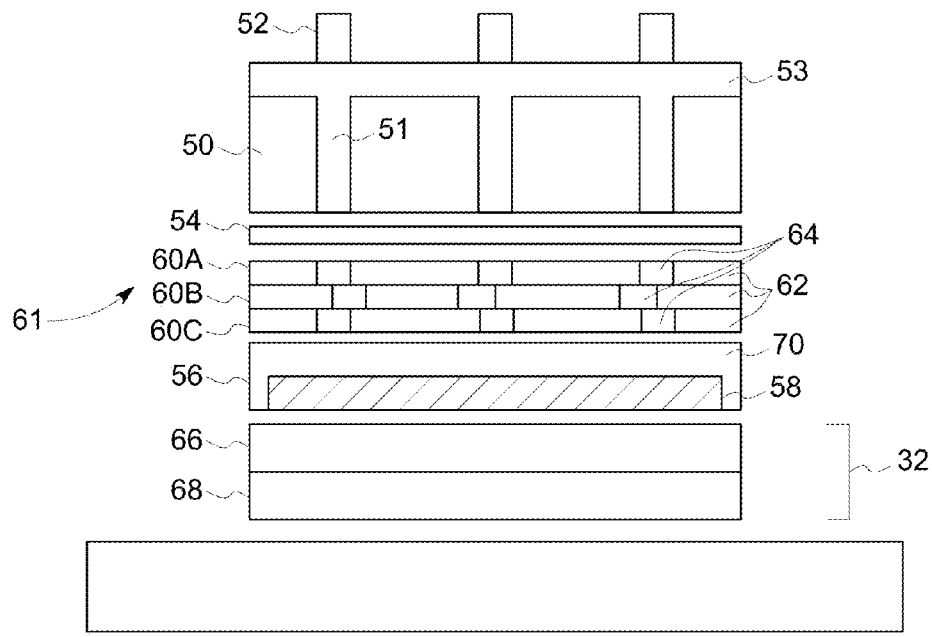
FIG. 2 depicts components of a detector assembly, including a stack of one or more barrier layers, in accordance with an embodiment of the present disclosure.

With the preceding in mind, and referring now to FIG. 2, components of an embodiment of the detector assembly 15 are illustrated. Specifically, in the illustrated embodiment, the detector assembly 15 includes a scintillator 50, pixilation dividers 51, an anti-scatter grid 52, a photodiode layer 54, signal circuitry 56, and the DAS 32. In certain embodiments, the signal circuitry 56 may include an analog-to-digital converter 58, as further described in detail below. In particular, in certain embodiments, the detector assembly 15 may include one or more barrier layers 60 (e.g., a first barrier layer 60A, a second barrier layer 60B, or a third barrier layer 60C) disposed between the photodiode layer 54 and the signal circuitry 56. The one or more barrier layers 60 may be stacked adjacent to one another to form a stack 61. Each of the one or more barrier layers 60 (e.g., the first barrier layer 60A, the second barrier layer 60B, or the third barrier layer 60C) may be formed of an electrical substrate 62, and a plurality of vias 64 may be disposed within the electrical substrate 62, either uniformly or in a non-uniform pattern, such as corresponding to the locations of the dividers 51, discussed below). In particular, each via 64 may be a radiation absorbing element filled with an ionizing energy absorbing material (e.g., high Z material), such as tungsten, alumina, molybdenum, hafnium, tantalum, or other X-ray blocking materials, or any combination thereof. Accordingly, as further described in detail below, each of the one or more barrier layers 60 may help reduce the amount of radiation 16 that reaches the signal circuitry 56 and/or the DAS 32.

During imaging, radiation 16 (e.g., X-rays) from the X-ray source 14 impinge on a scintillator 50 after being attenuated by an intervening subject or object undergoing imaging. In certain embodiments, the detector assembly 15 may include the anti-scatter grid 52 for limiting or reducing scattered radiation created during the imaging process. For example, the anti-scatter grid 52 may include structures of radiation absorbing material (e.g., tungsten strips) which absorb scattered radiation and reduce the impact of scatter radiation on the detector assembly 15. In certain embodiments, the scatter grid 50 may be disposed between the subject or object undergoing imaging and other components of the detector assembly 15.

The scintillator 50 may be formed from a substance that absorbs radiation 16 (for example X-ray photons) and in response emits light of a characteristic wavelength, such as an optical wavelength, thereby releasing the absorbed energy. In certain embodiments, various types of scintillation materials may be employed which convert the radiation incident on the detector assembly 20, such as X-rays photons, into a form of radiation detectable by the photodetector layer 54, e.g., a layer of photodiodes. Thus, in such embodiments, X-ray photons impinging on the detector assembly 15 can be detected by the photodetector layer 54, so long as the impinging X-ray photons interact with the scintillator 50 to generate one or more detectable photons, such as optical photons.

As noted above in certain situations, the scintillator 50 may be "pixilated" so as to divide the scintillator material into discrete elements, each of which may be associated with one or more respective underlying photodetection elements. In this manner a pixilated element of the scintillator 50 may correspond to a given photodiode or set of photodiodes of the photodiode layer 54. The material 53 used to divide the scintillator 50 into pixels, however, may be more transmissive of X-rays than the material forming the scintillator 50 and anti-scatter grid 52. As a result, these dividers 51 forming the pixels of the scintillator 50 may present a pathway through which X-ray may bypass the scintillator 50 in a high-energy form and reach the underlying electronics and signal conversion circuitry 56 and/or the DAS 32. Accordingly, in certain embodiments, the one or more barrier layers 60, discussed herein, are provided to reduce the amount of radiation 16 reaching the signal circuitry 56 and/or the DAS 32, as further described in detail below.

The photodetector layer 54 may generate analog electrical signals in response to the light emitted by the scintillator 50. In certain embodiments, the photodetector layer 54 may be bonded to the scintillator 50 by an epoxy bonding material and/or other suitable optical coupler. The electrical signals generated by the photodetector layer 54 are in turn acquired by the analog-to-digital converter 56 of the signal electronics 56. The signals from the signal electronics 56 may in turn be acquired by the DAS 32. As discussed above, the acquired signals are supplied to data processing circuitry and/or to image reconstruction circuitry.

In conventional arrangements, the analog signals generated by the photodetector layer 54 might be conducted by a conductive analog path to a downstream location for conversion from analog form to digital form and for subsequent processing. In such arrangements, the analog path typically conducts the analog signals to a downstream location that is spaced apart from the photodetector layer 54 and/or otherwise out of the path of any incident radiation (e.g., X-rays). In this way, the electronics performing the analog-to-digital signal conversion and any additional processing are protected from incidental radiation that is not absorbed and converted by the scintillator 50, the anti-scatter grid 52, and/or other radiation blocking components of the detector assembly 15. Such arrangements, however, can lead to the introduction of noise to the signal in proportion to the length of the analog pathway.

In certain embodiments of the present disclosure, signal electronics 56 (such as the analog-to-digital converter) and/or the DAS 32 may be provided directly behind the photodetector layer 54 (i.e., vertically stacked) so as to shorten the distance between these signal conversion and processing components and the signal origination (i.e., the photodetector layer 54). Such placement, however, places the signal electronics 56 and/or the DAS 32 in the path of any unconverted and/or unabsorbed radiation. In one such embodiment, the analog-to-digital converter 56 may be one or more chips or application specific integrated circuits (ASICs) (i.e., silicon packages) directly connected to photodiodes of the photodetector layer 52 in a vertically stacked arrangement. In such an embodiment, the ASICs may convert the analog signals generated at the photodiodes to digital signals for subsequent processing. For example, the analog-to-digital converter 58 may be a two-sided silicon package with one side directly connected to photodiodes of the photodetector layer 52 and the other side connected to a flex circuit 66 (e.g., flex circuit lines or underlying circuit) of the DAS 32. The flex circuit 66 may conduct the converted digital signals to downstream components 68 for subsequent processing. In certain embodiments, the flex circuit 66 may include a silicon overlay 70 to enhance or improve the conductivity between the flex circuitry 66 and the analog-to-digital converter 58. As noted above, the DAS 32 may provide sampled and digitized X-ray data to the image reconstructor 34, which may perform high-speed reconstruction to generate a reconstructed image.

While providing the signal electronics 56 directly behind and proximate to the photodetector layer 52 may reduce the noise that would otherwise be introduce by a lengthy analog signal path, such an arrangement also exposes the signal electronics 56 to potentially harmful radiation 16 to the extent such radiation is not absorbed or converted prior to reaching the signal electronics 56. Therefore, in certain embodiments of the present disclosure, the detector assembly 15 includes the stack 61 of one or more barrier layers 60 disposed between the photodiode layer 54 and the signal circuitry 56. It should be noted what while the illustrated embodiment depicts three barrier layers 60 (e.g., the first barrier layer 60A, the second barrier layer 60B, and the third barrier layer 60C) within the barrier layers stack 61, in other embodiments, any number of barrier layers 60 (e.g., 2, 3, 4, 5, 6, 7, 8, 10, or more) may be stacked between the photodiode layer 54 and the signal circuitry 56, as further described with respect to FIGS. 3, 6 and 7. Accordingly, the stack 61 may include any number of barrier layers 60. In certain embodiments, any number of stacks 61 may be disposed behind the photodetector layer 54.

In particular, as illustrated in the depicted embodiment, each barrier layer 60 may include one or more vias 64 (typically formed as a cylindrical or other geometry through-hole). Furthermore, each via 64 may function as a radiation absorbing element due to being filled with an ionizing energy absorbing material (e.g., high Z material), such as tungsten, molybdenum, lead, hafnium, tantalum, or other X-ray blocking materials, or any combination thereof. As noted above, the dividers 51 forming the pixels of the scintillator 50 may present a pathway through which X-ray may bypass the scintillator 50 to reach the signal conversion circuitry 56 and/or the DAS 32. Accordingly, in certain embodiments, the vias 64 of each one or more barrier layers 60 may be generally aligned below the dividers 51 to reduce the amount of radiation 16 reaching the signal circuitry 56 and/or the DAS 32, as further described in detail below. In certain embodiments, the vias 64 may be staggered between each barrier layer 60 of the stack 61, thereby increasing the effective radiation absorbing width of the of the vias 64 as seen from the direction of X-ray emission, as further described with respect to FIGS. 6 and 7.

For example, in certain embodiments, each via 64 may be filled with an ionizing energy absorbing material, such as a high Z (i.e., high atomic number) material suitable for absorbing or otherwise blocking the radiation 16 (e.g., X-rays). In one such embodiment, the high Z material is an electrically conductive material, such as a material suitable for conducting electrical charges and/or signals. For example, in one embodiment, the vias 64 may be filled with tungsten (atomic number 74). The high Z material can thereby protect any underlying signal electronics 56 from incident radiation. Other examples of high Z materials that may be employed include, but are not limited to, hafnium (atomic number 72), molybdenum (atomic number 42), lead (atomic number 82), tantalum (atomic number 73), and so forth. Thus, in one embodiment, a high Z material may be a material having an atomic number greater than 42. In another embodiment, a high Z material may be a material having an atomic number greater than 72. In certain embodiments, a mixture of one or more different high Z materials and/or a conductive mixture (e.g., a conductive paste mixture) of a high Z material with alumina may be used to fill the vias 64. For example, the vias 64 may be filled with a mixture of tungsten and aluminum, a mixture of tungsten and molybdenum, a mixture of molybdenum and aluminum, and so forth.

Furthermore, in certain embodiments, a plurality of cavities may be disposed within each barrier layer 60 in lieu of and/or in addition to the one or more vias 64 disposed within each barrier layer 60. Each cavity may be a radiation absorbing element filled with an ionizing energy absorbing material (e.g., high Z material), such as tungsten, molybdenum, lead, hafnium, tantalum, or other X-ray blocking materials, or any combination thereof. In particular, each cavity may be larger than or have a more open geometry than a via 64 and may be filled with a greater amount of the high Z material. For example, in certain embodiments, the via 64 may be between approximately 50 microns and 600 microns in diameter and between approximately 100 microns and 550 microns in length. Further, each cavity may be greater than approximately 600 microns in diameter and greater than approximately 550 microns in length. It should be noted that the dimensions, number, and arrangement of each cavity and/or each via 64 within each barrier layer 60 may be designed to meet desired amount of radiation blocking for the detector assembly 15, as further described with respect to FIGS. 6 and 7. Furthermore, it should be noted that the dimensions, number, and arrangement of each cavity and/or each via 64 within each barrier layer 60 may be designed to implement conventional techniques for routing conductors, as further described with respect to FIGS. 6 and 7.

As noted above, the electrical substrate of each barrier layer 60 may include an arrangement of one or more vias 64 and/or one or more cavities. In certain embodiments, the electrical substrate 62 may be an organic substrate formed of lead, lead alloy, various conductive pastes, tin lead, lead particles in silver conductive epoxy, nickel coated tungsten or molybdenum particles in epoxy, or any combination thereof. In certain embodiments, the electrical substrate 62 may be a ceramic or composite material formed so as to include an ionizing energy absorbing material (e.g., high Z material), such as tungsten, molybdenum, lead, hafnium, tantalum, or other X-ray blocking materials, or any combination thereof.

In particular, each barrier layer 60 of the stack 61 may be formed using one or more different manufacturing processes, such as semi-conductor lithography processes, screen printing processing, mechanical punching or drilling techniques, or a combination thereof. For example, in certain embodiments, the vias 64 of each barrier layer 60 may be formed by forming a plurality of holes, through-holes, or cylindrical hollow spaces within the electrical substrate 60. For example, the vias 64 may be formed by punching or drilling holes or spaces into the electrical substrate 60. As a further example, in some embodiments, the holed or spaces may be created by various etching techniques, such as those used in semiconductor fabrications. In particular, the physical characteristics (e.g., dimensions, number, density, arrangement, shape, and/or patterns) of the generated holes or spaces may be determined by the type and amount of radiation blocking desired. Each of the formed holes or spaces may be filled with the high Z material (or a mixture of the high Z materials), and excess material may be removed. Further, the filled electrical substrate 60 may be shrunk through thermal (e.g., baking) techniques. In some situations, the amount and/or type of high Z material used may be determined or constrained by the type of manufacturing techniques utilized.

Figure 3:
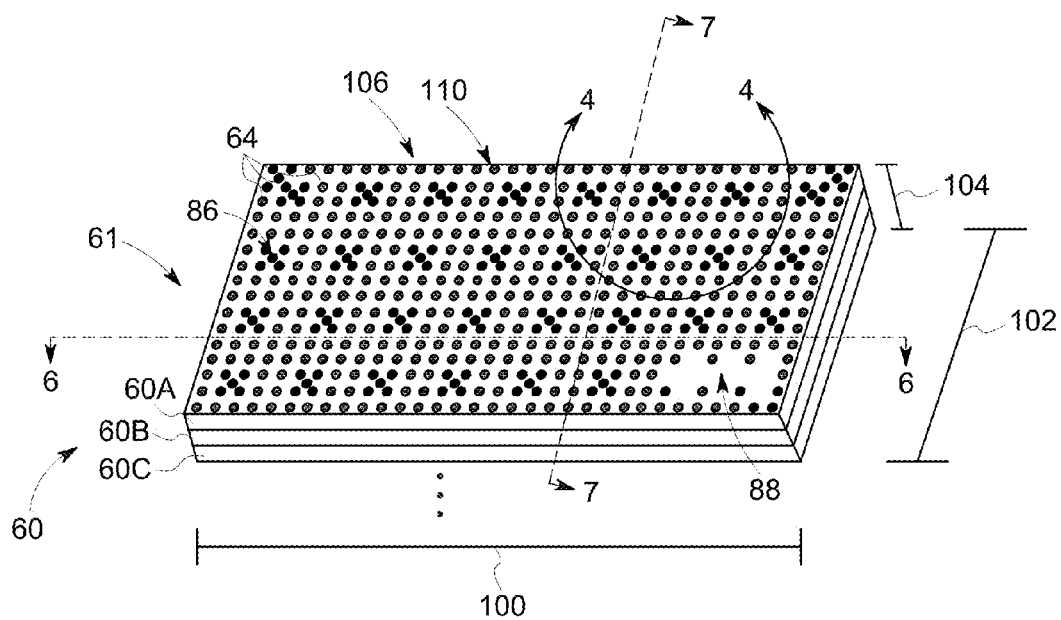
FIG. 3 depicts a top view of the stack of one or more barrier layers of FIG. 2, in accordance with an embodiment of the present disclosure.

FIG. 3 depicts a top view of the stack 61 of the one or more barrier layers 60, in accordance with an embodiment of the present disclosure. Specifically, in the illustrated embodiment, the stack 61 includes the first barrier layer 60A, the second barrier layer 60B, and the third barrier layer 60C. However, it should be noted that in other embodiments, the stack 61 may include any number of the barrier layers 60 (e.g., 4, 5, 6, 7, 8, 9, 10 or more) and any number of stacks 61 (e.g., 2, 3, 4, 5 or more) may be disposed within the detector assembly 15. In particular, as noted above with respect to FIG. 2, the stack 61 of the one or more barrier layers 60 may be disposed between the photodiode layer 54 and the signal circuitry 56. As noted above, each barrier layer 60 may be formed of the electrical substrate 62 and may include a plurality of vias 64. In certain embodiments, each barrier layer 60 may include a plurality of cavities in lieu of and/or in addition to the vias 64.

In the illustrated embodiment, each barrier layer 60 includes one or more vias 64 arranged within the electrical substrate 62. As noted above, each of the one or more vias 64 may be filled with an ionizing energy absorbing material (e.g., high Z material), such as tungsten, alumina, molybdenum, hafnium, tantalum, or other X-ray blocking materials, or any combination thereof. In certain embodiments, the plurality of vias 64 may be arranged within the electrical substrate 62 of each barrier layer 60 to provide localized radiation blocking and/or absorption features. For example, in certain embodiments, a first location 86 on the first barrier layer 82 may include a greater number of vias 64 than a second location 88 on the first barrier layer 82, thereby absorbing or blocking a greater amount of radiation 16 at the first location 86 than the second location 88. It should be noted that the design features of each via 64 and/or one or more vias 64 (e.g., dimensions, number, density, arrangement, shape, and/or patterns) may be selected or designed to provide localized radiation protection based on an amount of radiation formed during the imaging process. Accordingly, in certain embodiments, the vias 64 between one or more barrier layers 60 (e.g., between the first barrier layer 80, the second barrier layer 82, and/or the third barrier layer 84) may be arranged or designed to provide localized radiation protection based on an amount of radiation formed during the imaging process. In particular, for regions of the detector assembly 15 that produce a greater amount of radiation, a greater density of vias 64 within a single barrier layer 60 or between one or more barrier layers 60 may be utilized to meet a desired amount of radiation blocking.

In certain embodiments, a length 100 of the stack 61 may be between approximately 10 and 200 millimeters, and a width 102 of the stack 61 may be between approximately 5 and 190 millimeters. A thickness 104 of the stack 61 may be designed to meet the desired amount of radiation blocking or desired amount of localized radiation blocking. For example, in certain embodiments, the thickness of each barrier layer 60 may be between approximately 50 micrometers and 500 micrometers, while the thickness 104 of the stack 61 may be between approximately 150 micrometers and 5 millimeters. Accordingly, the thickness 104 of the stack 61 may be determined the number of individual barrier layers 60 stacked to form the stack 61. The stack 61 may include a surface 106 and an internal structure 108, as further described in detail with respect to FIGS. 4 and 5.

Figure 4:
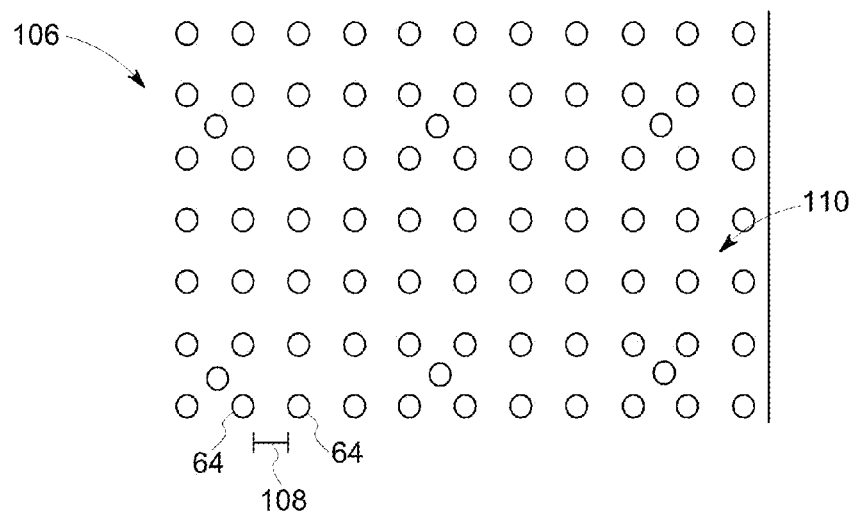
FIG. 4 depicts a top detailed view of a surface of the stack of one or more barrier layers of FIG. 3, taken along view line 4, in accordance with an embodiment of the present disclosure.

FIG. 4 depicts a top detailed view of the surface 106 of the first barrier layer 60A of the stack 61 illustrated in FIG. 3, taken along view line 4, in accordance with an embodiment of the present disclosure. In certain embodiments, the surface 106 may include an alumina coating or layer. A separation distance 108 between two or more vias 64 may be variable, and in certain embodiments, may be between approximately 0.3 to 5 millimeters. As noted above, physical characteristics and features of the vias 64 (e.g., dimensions, number, density, arrangement, shape, and/or patterns) may be designed to meet the desired amount of radiation blocking.

Figure 5:
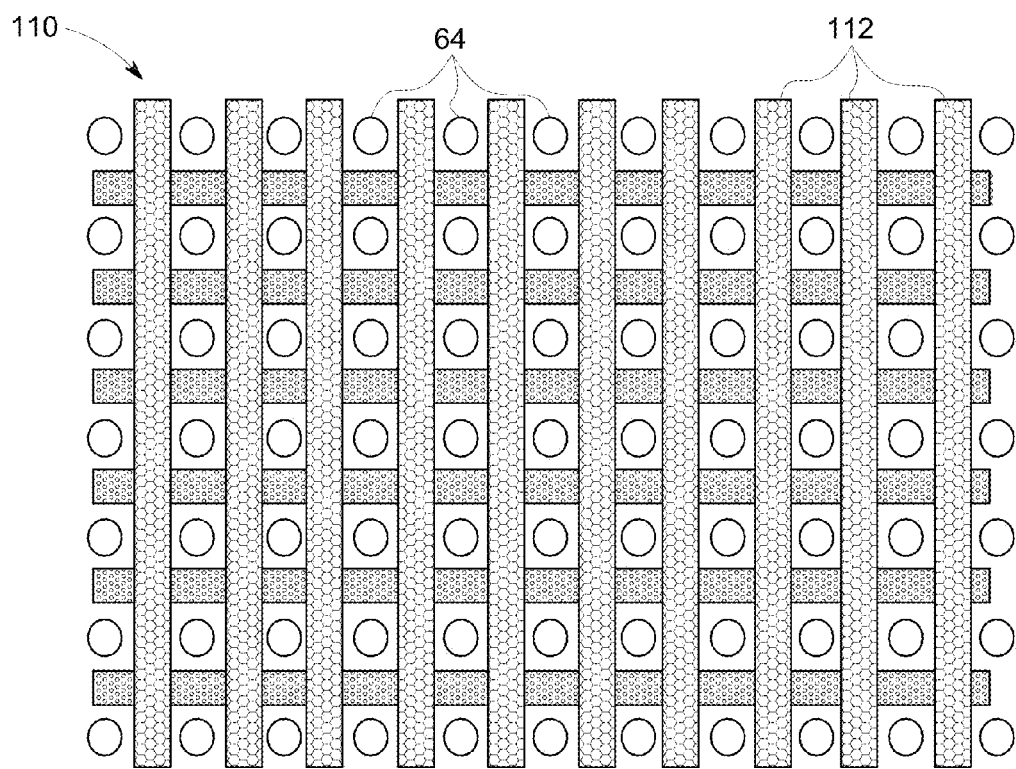
FIG. 5 depicts a top detailed view of an internal structure of the stack of one or more barrier layers of FIG. 3, in accordance with an embodiment of the present disclosure.

FIG. 5 depicts a detailed view of the internal structure 110 of the stack 61 of FIG. 3, in accordance with an embodiment of the present disclosure. In certain embodiments, the internal structure 110 may include a matrix of one or more layer lines 112 defined by each of the one or more barrier layers 60. Indeed, each of the one or more vias 64 may be disposed within the matrix and may be filled with an ionizing energy absorbing material (e.g., high Z material), such as tungsten, alumina, molybdenum, hafnium, tantalum, or other X-ray blocking materials, or any combination thereof.

Figure 6:
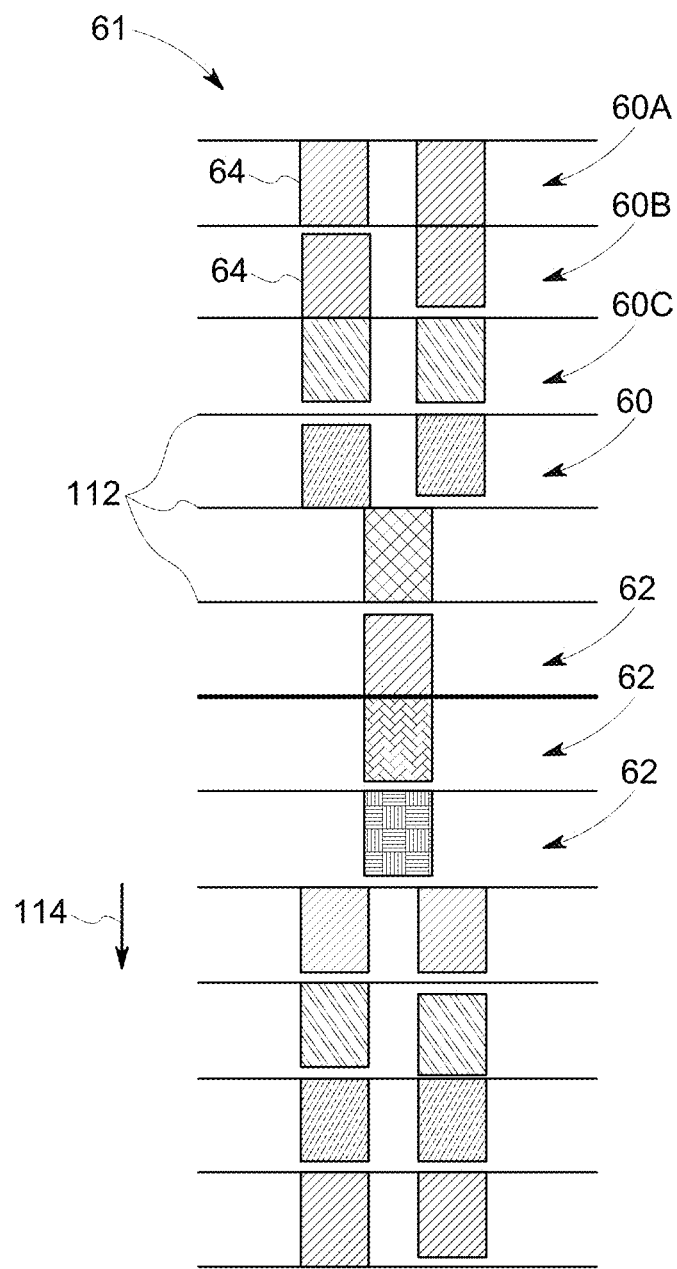
FIG. 6 depicts a cross-sectional view of the one or more barrier layers of FIG. 3 across cut lines 6-6, in accordance with an embodiment of the present disclosure.

FIG. 6 depicts a cross-sectional view of the stack 61 of FIG. 3 across cut lines 6-6, in accordance with an embodiment of the present disclosure. Specifically, the illustrated embodiment depicts the stack 61 with a plurality of barrier layers 60, such as the first barrier layer 60A, the second barrier layer 60B, the third barrier layer 60C, and so forth. In particular, the illustrated embodiment depicts a cross-sectional view of the stack 61 in a Z-direction 114, which may be the direction of X-ray emission (e.g., vertically through the scintillator 50, the photodetector layer 54, the one or more barrier layers 60, and the signal circuitry 56). Furthermore, each barrier layer 60 may include one or more vias 64 and may be separated by one or more layer lines 112 (e.g., top and bottom surfaces of the barrier layers 60).

In certain embodiments, the vias 64 may be arranged within each barrier layer 60 and between one or more barrier layers 60 to provide localized radiation protection for the signal circuitry 56 and/or the DAS 32 based on an amount of radiation formed during the imaging process. In particular, the geometrical features of the vias 64 and the physical arrangement of the vias 64 within and between each barrier layer 60 may be designed to increase or maximize an amount of radiation blocked and/or absorbed. For example, in certain embodiments, the vias 64 of the stack 61 may be positioned below the photodetector layer 54 to align with the X-ray transmissive dividers 51 of the scintillator 50. In this manner, the vias 64 may be arranged to block incident radiation from passing through the dividers 51 and from reaching the signal circuitry 56. Furthermore, in addition to radiation blocking, the vias 64 may be arranged to provide electrical continuity for a conductor routed from the photodetector layer 54 to the signal circuitry 56, as further described below.

For example, the arrangement of the vias 64 may be designed to implement conventional techniques for routing conductors. In certain embodiments, conductors may be routed through the vias 64 from the photodiode layer 54 and to the analog-to-digital converter 58. Specifically, the photodiode layer 54 may include a plurality of photodiodes, and each photodiode may generate an analog signal that is routed through the via 64 using a conductor. The analog signals generated by the photodetector layer 54 may be conducted by a conductive analog path through individual vias 64 disposed within the one or more barrier layers 60. The conductive analog path may be routed through the stack 61 to the analog-to-digital converter 58 for conversion from analog form to digital form and for subsequent processing.

Accordingly, in addition to providing a desired amount of radiation blocking, the vias 64 disposed between each of the one or more barrier layers 60 may be arranged to facilitate electrical continuity through the stack 61 for routing the conductors and the analog path through one or more barrier layers 60.

Figure 7:
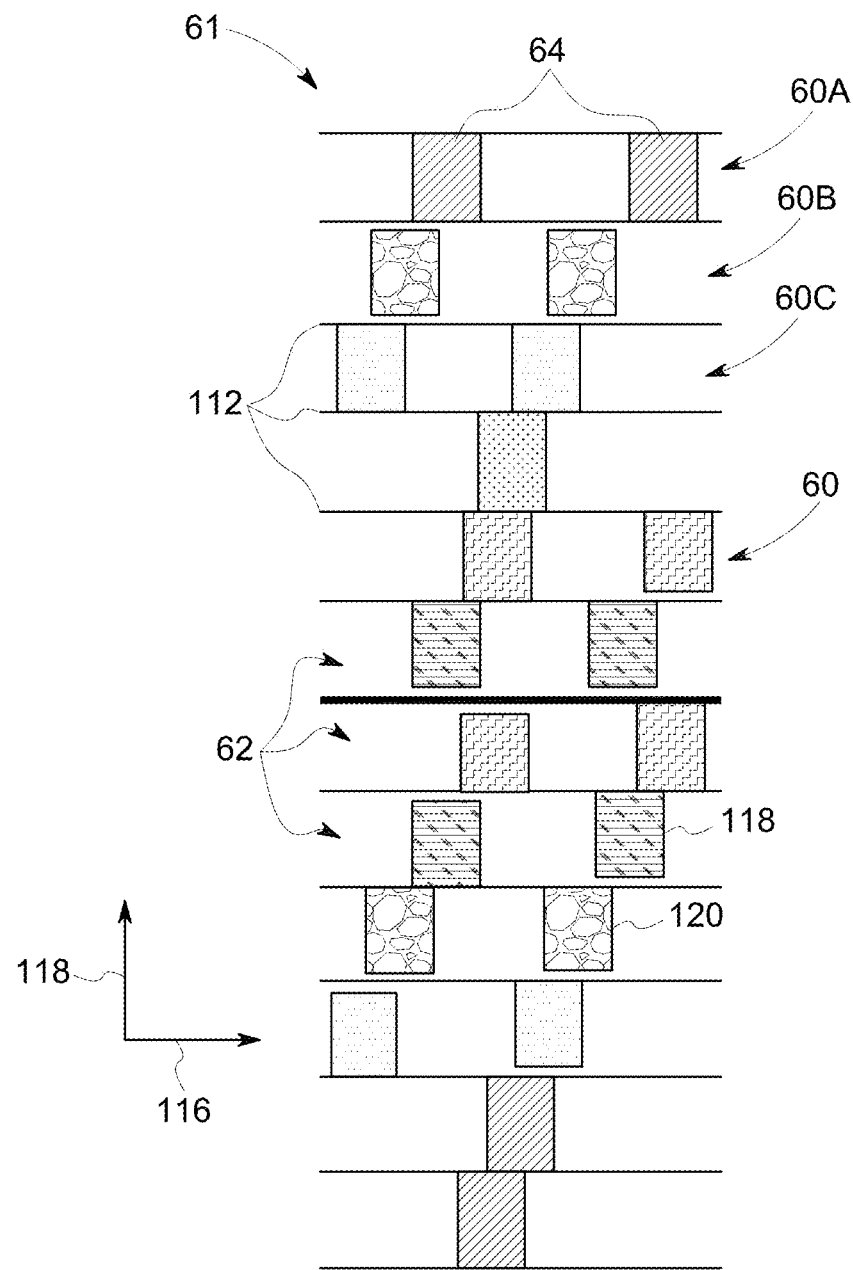
FIG. 7 depicts a cross-sectional view of the one or more barrier layers of FIG. 3 across cut lines 7-7, in accordance with an embodiment of the present disclosure.

FIG. 7 depicts a cross-sectional view of the stack 61 of FIG. 3 across cut lines 7-7, in accordance with an embodiment of the present disclosure. Specifically, the illustrated embodiment depicts the stack 61 with a plurality of barrier layers 60, such as the first barrier layer 60A, the second barrier layer 60B, the third barrier layer 60C, and so forth. In particular, the illustrated embodiment depicts a cross-sectional view of the stack 61 in a X-direction 116 and a Y-direction 118, which may be a view along the width 102 of the stack 61.

As noted above, the vias 64 may be arranged within each barrier layer 60 and between one or more barrier layers 60 to provide localized radiation protection for the signal circuitry 56 and/or the DAS 32 based on an amount of radiation formed during the imaging process. In certain embodiments, the vias 64 between the barrier layers 60 of the stack 61 may be staggered between each barrier layer 60 to increase the effective radiation absorbing area along the width 102 of the stack 21. In certain embodiments, staggered vias 64 may be beneficial in absorbing or blocking radiation traveling through the scintillator 50 and/or the photodetector layer 54 at incident angles between approximately 5 and 85 degrees.

In certain embodiments, each of the one or more vias 64 may be filled with a different amount or a different type of the ionizing energy absorbing material (e.g., high Z material). Accordingly, certain vias 64 and/or certain barrier layer 60 may include different amounts of the high Z material and/or different mixtures of radiation blocking materials. For example, a first via 118 may include a mixture of tungsten and alumina while a second via 120 may include a mixture of molybdenum and aluminum. It should be noted that the type and amount of material used to fill the vias 64 may be determined by the desired type and amount of radiation blocked desired for certain regions of the stacked barrier layers 60.

Technical effects of the disclosure include a stack 61 having one or more (e.g., 1, 2, 3, 4, 5, 6, 7, 8, 9, 10 or more) barrier layers 60. In certain embodiments, the stack 61 may be disposed between the photodiode layer 54 and the analog-to-digital converter 58 of the detector assembly 15. In particular, each of the one or more barrier layers 60 may be formed of an electrical substrate 62 (e.g., ceramic substrates, organic substrates, etc.), and each barrier layer 60 may include a plurality of vias 64 disposed within the electrical substrate 62. In certain embodiments, the vias 64 may be filled with an ionizing energy absorbing material (e.g., high Z material) to help absorb radiation. For example, each via 64 may be filled with tungsten, molybdenum, a mixture of tungsten and alumina, a mixture of tungsten and molybdenum, a mixture of molybdenum and alumina, or any combination thereof. In particular, the plurality of vias 64 may be arranged within each barrier layer 60 and between one or more barrier layers 60 to provide a desired amount of radiation. For example, the vias 64 may be arranged to align with one or more gaps caused by the dividers 51 of the scintillator 50, thereby reducing incident radiation from reaching the signal circuitry 56. Further, the vias 64 may be staggered between one or more barrier layers 60 to increase the effective radiation area within the stack 61. Accordingly, the vias 64 may help reduce an amount of radiation from reaching the signal circuitry 56 and/or the DAS 32. In addition, in certain embodiments, the vias 64 may additionally provide electrical continuity for conductors that provide analog signal pathways from each photodiode of the photodiode layer 54 to the analog-to-digital converter 56 of the detector assembly 15.

This written description uses examples to disclose the described embodiments, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A radiation detector comprising:
a scintillator layer configured to convert incident radiation into lower energy optical photons, wherein the scintillator layer comprises a plurality of pixels formed by one or more dividers, and wherein the one or more dividers form one or more radiation pathways through the scintillator layer;
a photodetector layer configured to detect the lower energy photons generated by the plurality of pixels within the scintillator layer;
signal electronics configured to receive signals generated by the photodetector layer; and
one or more barrier layers disposed between the photodetector layer and the signal electronics, wherein each barrier layer of the one or more barrier layers comprises electrically conductive vias containing a high Z material positioned to block high energy radiation that passes through the one or more radiation pathways from reaching the signal electronics, wherein the vias are arranged within the electrical substrate to substantially align with the one or more radiation pathways of the scintillator layer.

2. The radiation detector of claim 1, wherein each barrier layer comprises a plurality of vias that pass through an electrical substrate, and wherein each via from the plurality of vias is filled with the high Z material.

3. The radiation detector of claim 2, wherein the high Z material comprises one or more of tungsten, lead, hafnium, molybdenum, tantalum, a mixture of tungsten and alumina, a mixture of tungsten and molybdenum, a mixture of molybdenum and alumina, or any combination thereof.

4. The radiation detector of claim 2, wherein the electrical substrate is formed of a ceramic material or an organic material.

5. The radiation detector of claim 2, wherein the plurality of vias are staggered between the one or more barrier layers to increase the effective radiation blocking area of the one or more barrier layers or to eliminate scatter radiation from the scintillator layer or the photodetector layer.

6. The radiation detector of claim 1, wherein the photodetector layer comprises a plurality of photodiodes associated with the plurality of pixels of the scintillator layer.

7. The radiation detector of claim 1, wherein the signal electronics comprise one or more application specific integrated circuits (ASICs).

8. The radiation detector of claim 1, wherein the signal electronics comprise analog-to-digital conversion circuitry configured to convert the signals from an analog form to a digital form.

9. A radiation detector comprising:
- a photodetector layer configured to detect the lower energy photons generated by a scintillator layer;
- analog-to-digital conversion circuitry configured to receive signals generated by the photodetector layer; and
- one or more stacked barrier layers disposed between the photodetector layer and the analog-to-digital conversion circuitry, wherein each barrier layer of the one or more barrier layers comprises a plurality of vias that pass through an electrical substrate, and wherein the plurality of vias are filled with a high Z material positioned to block or absorb high energy incident radiation that passes through one or more radiation pathways of the scintillator layer from reaching the analog-to-digital conversion circuitry, wherein the vias are arranged within the electrical substrate of each barrier layer to substantially align with the one or more radiation pathways of the scintillator layer.

10. The radiation detector of claim 9, wherein the plurality of vias are staggered between the one or more stacked barrier layers to increase an effective radiation blocking area of the one or more barrier layers.

11. The radiation detector of claim 9, wherein a density, a size, a shape, a length, a width, a thickness, a pattern, or a number of each via from the plurality of vias may be designed to shield the analog-to-digital conversion circuitry from radiation.

12. The radiation detector of claim 9, wherein the high Z material comprises one or more of tungsten, lead, hafnium, molybdenum, tantalum, a mixture of tungsten and aluminum, a mixture of tungsten and molybdenum, a mixture of molybdenum and aluminum, or any combination thereof.

13. The radiation detector of claim 9, wherein the electrical substrate is a ceramic substrate comprises one or more of tungsten, lead, hafnium, molybdenum, or tantalum.

14. The radiation detector of claim 9, wherein the electrical substrate is an organic substrate comprises one or more of lead, lead alloy, or various conductive pastes.

15. A method for manufacturing one or more barrier layers of a radiation detector, comprising:
- forming a plurality of vias into two or more electrical substrates, wherein the plurality of vias are positioned within each electrical substrate to block high energy radiation that passes through one or more radiation pathways of a scintillator;
- filling each via of the plurality of vias with a high Z material; and
- stacking the two or more electrical substrates such that the plurality of filled vias are staggered with respect to one another, wherein the plurality of filled vias are arranged to substantially align with the one or more radiation pathways of the scintillator.

16. The method of claim 15, wherein the high Z material comprises one or more of tungsten, lead, hafnium, molybdenum, tantalum, a mixture of tungsten and aluminum, a mixture of tungsten and molybdenum, a mixture of molybdenum and aluminum, or any combination thereof.

17. The method of claim 15, wherein the electrical substrate is an organic substrate or a ceramic substrate.

18. The method of claim 15, comprising punching or drilling the plurality of vias into the two or more electrical substrates.

* * * * *